United States Patent
Kamei et al.

(10) Patent No.: US 9,702,056 B2
(45) Date of Patent: Jul. 11, 2017

(54) PRODUCTION APPARATUS OF SIC SINGLE CRYSTAL BY SOLUTION GROWTH METHOD, METHOD FOR PRODUCING SIC SINGLE CRYSTAL USING THE PRODUCTION APPARATUS, AND CRUCIBLE USED IN THE PRODUCTION APPARATUS

(75) Inventors: Kazuhito Kamei, Tokyo (JP);
Kazuhiko Kusunoki, Tokyo (JP);
Nobuyoshi Yashiro, Tokyo (JP);
Nobuhiro Okada, Tokyo (JP);
Hironori Daikoku, Susono (JP);
Motohisa Kado, Susono (JP);
Hidemitsu Sakamoto, Susono (JP)

(73) Assignees: NIPPON STEEL & SUMITOMO METAL CORPORATION, Tokyo (JP); TOYOTA JIDOSHA KABUSHIKI KAISHA, Aichi (JP)

( * ) Notice: Subject to any disclaimer, the term of this patent is extended or adjusted under 35 U.S.C. 154(b) by 228 days.

(21) Appl. No.: 14/126,942

(22) PCT Filed: Jun. 11, 2012

(86) PCT No.: PCT/JP2012/064938
§ 371 (c)(1),
(2), (4) Date: Dec. 17, 2013

(87) PCT Pub. No.: WO2012/176647
PCT Pub. Date: Dec. 27, 2012

(65) Prior Publication Data
US 2014/0116325 A1    May 1, 2014

(30) Foreign Application Priority Data
Jun. 20, 2011    (JP) .................. 2011-136600

(51) Int. Cl.
*C30B 15/10* (2006.01)
*C30B 35/00* (2006.01)
(Continued)

(52) U.S. Cl.
CPC .............. *C30B 15/10* (2013.01); *C30B 17/00* (2013.01); *C30B 19/02* (2013.01); *C30B 19/08* (2013.01);
(Continued)

(58) Field of Classification Search
CPC ......... C30B 29/36; C30B 19/02; C30B 15/10; C30B 35/00
(Continued)

(56) References Cited

U.S. PATENT DOCUMENTS

| 3,342,559 A | 9/1967 | Dermatis |
| 2012/0043644 A1* | 2/2012 | Ono ................. C30B 29/06 257/607 |

FOREIGN PATENT DOCUMENTS

| JP | 2004-323247 | 11/2004 |
| JP | 2006-131433 | 5/2006 |

(Continued)

OTHER PUBLICATIONS

Japan Platform for Patent Information, English computer translation of JP 2004-323247 (2015).*
(Continued)

*Primary Examiner* — Matthew Song
(74) *Attorney, Agent, or Firm* — Clark & Brody

(57) ABSTRACT

A region of an SiC solution in the vicinity of an SiC seed crystal is cooled while suppressing the temperature variation in a peripheral region of the SiC solution. An apparatus includes a seed shaft and a crucible for an SiC solution. The seed shaft has a lower end surface for attachment to an SiC seed crystal. The crucible comprises a main body, an inter- (Continued)

mediate cover, and a top cover. The main body includes a first cylindrical portion and a bottom portion at a lower end portion of the first cylindrical portion. The intermediate cover is within the first cylindrical portion and above the liquid level of the SiC solution in the main body. The intermediate cover has a first through hole for the seed shaft. The top cover is disposed above the intermediate cover and has a second through hole for the seed shaft to pass through.

5 Claims, 6 Drawing Sheets

(51) Int. Cl.
  *C30B 19/02* (2006.01)
  *C30B 29/36* (2006.01)
  *C30B 17/00* (2006.01)
  *C30B 19/08* (2006.01)

(52) U.S. Cl.
  CPC .............. *C30B 29/36* (2013.01); *C30B 35/00* (2013.01); *Y10T 117/1032* (2015.01)

(58) Field of Classification Search
  USPC .............................. 117/36, 64, 206, 217, 951
  See application file for complete search history.

(56) References Cited

FOREIGN PATENT DOCUMENTS

| JP | 2011098870 A | * | 5/2011 |
| TW | M307625 | | 3/2007 |
| WO | 2010/024390 | | 3/2010 |

OTHER PUBLICATIONS

Japan Platform for Patent Information, English Computer translation of JP 2011-098870 A (2016).*

* cited by examiner

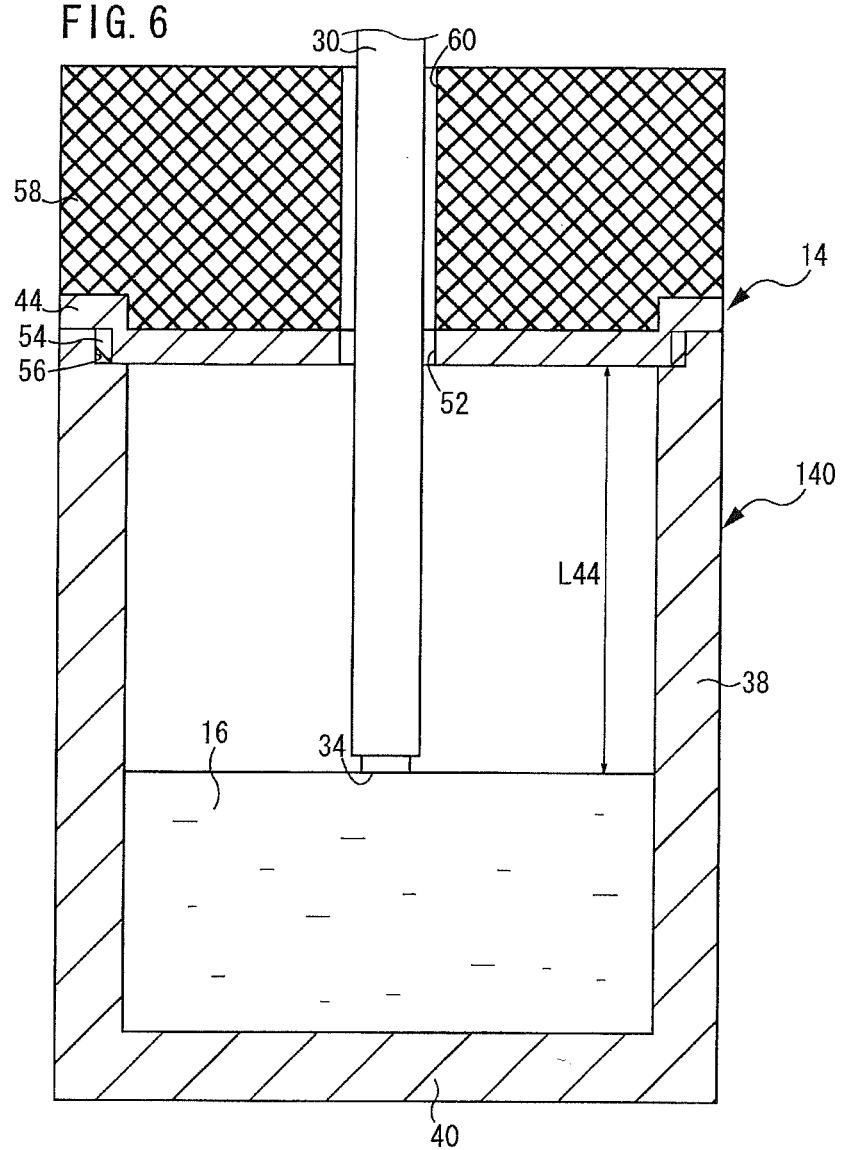

PRODUCTION APPARATUS OF SIC SINGLE CRYSTAL BY SOLUTION GROWTH METHOD, METHOD FOR PRODUCING SIC SINGLE CRYSTAL USING THE PRODUCTION APPARATUS, AND CRUCIBLE USED IN THE PRODUCTION APPARATUS

TECHNICAL FIELD

The present invention relates to a production apparatus of an SiC single crystal by a solution growth method, a method for producing an SiC single crystal using the same production method, and a crucible used in the same production apparatus.

BACKGROUND ART

The solution growth method has been known as a method for producing a single crystal of silicon carbide (SiC). In the solution growth method, an SiC seed crystal, which is to be attached to a lower end surface of a seed shaft, is brought into contact with an SiC solution accommodated in a crucible. Thereafter, the SiC seed crystal is pulled up to grow an SiC single crystal on the SiC seed crystal. The SiC solution as used herein refers to a solution in which carbon (C) is dissolved in a melt of Si or an Si alloy.

In the solution growth method, the temperature in a region of the SiC solution in the vicinity of and directly below an SiC seed crystal which is in contact with the SiC solution (hereafter, simply referred to as a vicinity region) is kept lower than in other regions. Specifically, the lower end portion of the seed shaft is cooled by a coolant (gas or water) flowing through the inside of the seed shaft, or by heat dissipation by the heat conduction through the seed shaft. The lower end portion of the seed shaft thus cooled then cools the SiC seed crystal, and also cools a vicinity region thereof. This causes SiC in the vicinity region to be supersaturated, thereby facilitating the growth of an SiC single crystal. In short, the heat of the vicinity region is dissipated by the seed shaft, thereby placing the vicinity region into a supercooled state.

However, if the temperature in a region other than the vicinity region (hereafter, referred to as a peripheral region) of the SiC solution varies, SiC polycrystals are likely to be formed by natural nucleation in the peripheral region. The SiC polycrystals thus formed are moved to the SiC seed crystal by the flow of the SiC solution. If a large amount of SiC polycrystals adhere to the SiC single crystal which has grown on the SiC seed crystal, the growth of the SiC single crystal may be impaired.

Production methods of an SiC single crystal intended for suppressing the formation of SiC polycrystals are disclosed in JP2004-323247A (Patent Literature 1) and JP2006-131433A (Patent Literature 2).

In the production method disclosed in Patent Literature 1, a heat insulating member made up of a black-lead cover or a graphite cover is disposed above a solution surface to suppress the heat release from the surface of the SiC solution. In the production method disclosed in Patent Literature 2, a heat insulating member is disposed in a free space above a crucible to adjust an in-plane temperature difference in the surface of an SiC solution to be within 40° C.

DISCLOSURE OF THE INVENTION

The production methods described in Patent Literatures 1 and 2 can reliably suppress the variation in temperature in the peripheral region of the SiC solution. However, in these literatures, a heat insulation member which is disposed above the solution surface in a crucible surrounds a seed shaft. Therefore, the temperature of the seed shaft will be retained by the heat insulation member. As a result, heat dissipation through the seed shaft will be impaired so that the vicinity region may not be efficiently supercooled.

It is an object of the present invention to provide a production apparatus of an SiC single crystal by a solution growth method, which can efficiently cool a region of an SiC solution in the vicinity of an SiC seed crystal while suppressing the variation in temperature in a peripheral region of the SiC solution.

A production apparatus of an SiC single crystal according to an embodiment of the present invention includes a seed shaft and a crucible. The seed shaft has a lower end surface to which an SiC seed crystal is to be attached. The crucible accommodates an SiC solution. The crucible comprises a main body, an intermediate cover, and a top cover. The main body includes a first cylindrical portion, and a bottom portion disposed at a lower end portion of the first cylindrical portion. The intermediate cover is disposed within the first cylindrical portion and above the liquid level of the SiC solution in the main body. The intermediate cover has a first through hole through which the seed shaft is to be passed. The top cover is disposed above the intermediate cover. The top cover has a second through hole through which the seed shaft is to be passed.

The production apparatus of an SiC single crystal according to an embodiment of the present invention can cool a region of an SiC solution in the vicinity of an SiC seed crystal while suppressing the supercooling of a peripheral region of the SiC solution.

BRIEF DESCRIPTION OF DRAWINGS

FIG. 6 is a longitudinal sectional view of a crucible which is used for comparison purpose in a simulation of the production apparatus shown in FIG. 1, and which has a different structure from that of the crucibles shown in FIGS. 2 and 4.

DESCRIPTION OF EMBODIMENTS

Figure 1:
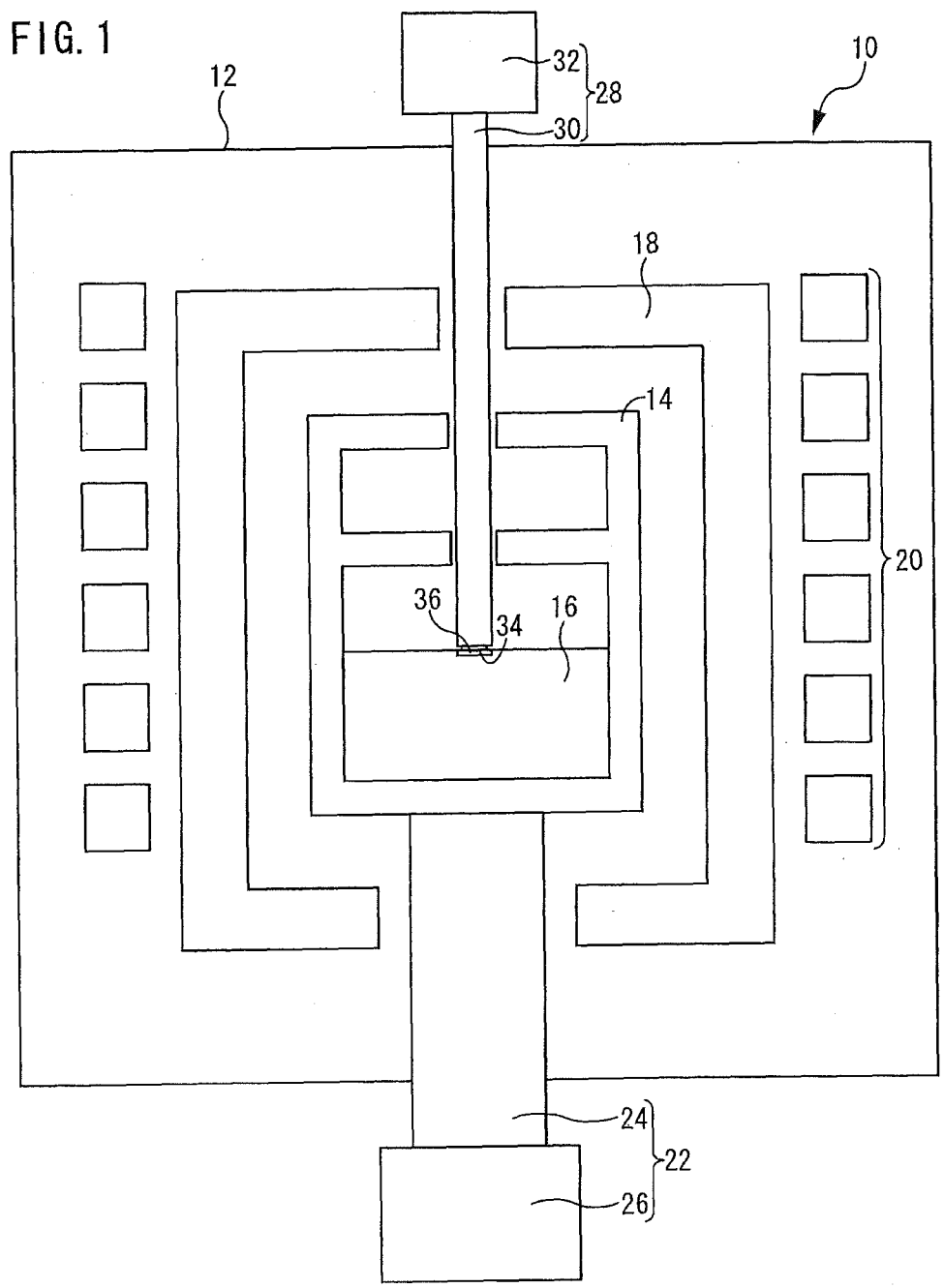
FIG. 1 is a schematic view of a production apparatus of an SiC single crystal according to an embodiment of the present invention.

A production apparatus of an SiC single crystal according to an embodiment of the present invention includes a seed shaft and a crucible. The seed shaft has a lower end surface to which an SiC seed crystal is to be attached. The crucible accommodates an SiC solution. The crucible comprises a main body, an intermediate cover, and a top cover. The main body includes a first cylindrical portion, and a bottom portion disposed at a lower end portion of the first cylindrical portion. The intermediate cover is disposed within the first cylindrical portion and above the liquid level of the SiC solution in the main body. The intermediate cover has a first through hole through which the seed shaft is to be passed. The top cover is disposed above the intermediate cover. The top cover has a second through hole through which the seed shaft is to be passed.

In this case, the temperature of a space formed above the intermediate cover (which is a space formed between the intermediate cover and the top cover, and is hereafter referred to as a cooling space) becomes lower than the temperature of a space formed below the intermediate cover (which is a space formed between the liquid level of the SiC solution and the intermediate cover, and is hereafter referred to as a heat reserving space). Since the cooling space allows to inhibit the temperature of the seed shaft from being retained, the seed shaft effectively dissipates heat of a vicinity region of the SiC solution. Consequently, the SiC solution becomes supersaturated in the vicinity region, and thus the growth of an SiC single crystal is facilitated. Further, the heat reserving space enables to suppress the occurrence of temperature variation in a region (peripheral region) other than the vicinity region of the SiC solution. Consequently, the formation of SiC polycrystals by natural nucleation can be suppressed.

Preferably, the intermediate cover further includes a second cylindrical portion. The second cylindrical portion extends downwardly from the lower surface of the intermediate cover. The seed shaft is to be passed through the second cylindrical portion. The lower surface of the second cylindrical portion is located apart from the liquid level of the SiC solution. In this case, the temperature difference between the cooling space and the heat reserving space further increases.

Preferably, the upper surface of the intermediate cover declines from the outer circumference side to the inner circumference side. In a production apparatus according to the present embodiment, the raw material of SiC solution (hereafter, referred to as an SiC raw material) is housed in the crucible. Then, the crucible is heated to melt the SiC raw material, thereby forming an SiC solution. In the crucible according to the present embodiment, the SiC raw material is housed between the bottom portion and the intermediate cover, and further the SiC raw material is also housed between the intermediate cover and the top cover. If the upper surface of the intermediate cover of the crucible declines from the outer circumference side to the inner circumference side, when the SiC raw material housed between the intermediate cover and the top cover is heated to melt into an SiC solution, the SiC solution will flow downward through the first through hole with more ease.

A method for producing an SiC single crystal by a solution growth method according to the present invention comprises the steps of: providing a production apparatus including a seed shaft that extends in a vertical direction; providing a crucible that includes: a main body including a cylindrical portion and a bottom portion disposed at a lower end portion of the cylindrical portion, an intermediate cover disposed within the main body and having a first through hole through which the seed shaft is to be passed, and a top cover disposed above the intermediate cover and having a second through hole through which the seed shaft is to be passed; attaching an SiC seed crystal to a lower end surface of the seed shaft; heating the crucible housing a raw material to produce an SiC solution; bringing the SiC seed crystal attached to the lower end surface of the seed shaft into contact with the SiC solution; growing an SiC single crystal on the SiC seed crystal; and housing a raw material of the SiC solution in the crucible such that the liquid level of the SiC solution to be formed is located below the intermediate cover before forming the SiC solution.

In this case, the SiC raw material may be housed not only in between the bottom portion of the crucible and the intermediate cover, but also in between the intermediate cover and the top cover. The SiC raw material is made up of a plurality of lumps or powders. Therefore, when the plurality of lumps or powders are accumulated, a large number of voids are formed. The volume of the SiC raw material including voids (apparent volume) is larger than the volume of an SiC solution which is produced by melting the SiC raw material. Therefore, even when the SiC raw material is accommodated in between the intermediate covers and the top covers of the crucible as well, it is possible to adjust the liquid level of the SiC solution when it is produced, to be lower than the lower surface of the intermediate cover by adjusting the amount of accommodation. In this case, compared to a case where the SiC raw material is housed only in between the bottom portion of the crucible and the intermediate cover, it is possible to put the liquid level of the SiC solution closer to the lower surface of the intermediate cover, thereby decreasing the heat reserving space. Consequently, the effect of suppressing the temperature variation in the peripheral region of the SiC solution will be enhanced.

A production apparatus of an SiC single crystal according to the present embodiment described above will be described with reference to the drawings. The same or corresponding parts in the figures will be denoted by the same reference characters, and the description thereof will not be repeated.

[Configuration of Production Apparatus]

FIG. 1 is a schematic diagram of a production apparatus 10 of an SiC single crystal according to an embodiment of the present invention.

Referring to FIG. 1, a production apparatus 10 includes a chamber 12. The chamber 12 accommodates a crucible 14. The chamber 12 is cooled with water when an SiC single crystal is produced.

The crucible 14 accommodates an SiC solution 16. The SiC solution 16 contains silicon (Si) and carbon (C).

The SiC solution 16 is produced by melting an SiC raw material by heating. The SiC raw material is, for example, Si alone or a mixture of Si and another metal element. Examples of the metal element include titanium (Ti), manganese (Mn), chromium (Cr), cobalt (Co), vanadium (V), iron (Fe), and the like. Among these metal elements, preferable metal elements are Ti and Mn. A further preferable metal element is Ti. The SiC raw material is made up of a plurality of lumps (flakes or chips) or powders of the above described metal elements. The SiC raw material is, for example, chips of silicon and chips of sponge titanium. The SiC raw material may also contain carbon (C).

Preferably, the crucible 14 contains carbon. The crucible 14 may be made of, for example, graphite or SiC. The inner surface of the crucible 14 may be coated with SiC. This allows the crucible 14 to serve as a carbon source to the SiC solution 16.

A chamber 12 further accommodates a heat insulation member 18. The heat insulation member 18 is disposed so as to surround the crucible 14. In other words, the heat insulation member 18 accommodates the crucible 14.

The chamber 12 further accommodates a heating apparatus 20. The heating apparatus 20 is, for example, a high-frequency coil. The heating apparatus 20 is disposed so as to surround the side wall of the heat insulation member 18. In other words, the heat insulation member 18 and the crucible 14 are inserted into the heating apparatus 20.

Before producing an SiC single crystal, the above described SiC raw material is housed in the crucible 14. The heating apparatus 20 melts the SiC raw material by inductively heating the crucible 14, to produce an SiC solution 16. The heating apparatus 20 maintains the SiC solution 16 at a crystal growth temperature. The crystal growth temperature depends on the composition of the SiC solution 16. A common crystal growth temperature is 1600 to 2000° C.

The production apparatus 10 further includes a rotating apparatus 22. The rotating apparatus 22 includes a rotating shaft 24 and a driving source 26.

The rotating shaft 24 extends in a vertical direction. The upper end of the rotating shaft 24 is located in the heat insulation member 18. The crucible 14 is disposed at the upper end of the rotating shaft 24. The lower end of the rotating shaft 24 is located in the outside of the chamber 12. The rotating shaft 24 is connected to the driving source 26.

The driving source 26 is disposed below the chamber 12. When producing an SiC single crystal, the driving source 26 rotates the rotating shaft 24 around the central axis thereof. Thereby, the crucible 14 is rotated.

The production apparatus 10 further includes a hoisting unit 28. The hoisting unit 28 includes a seed shaft 30 and a driving source 32.

The seed shaft 30 extends in a vertical direction. The upper end of the seed shaft 30 is located in the outside of the chamber 12. The seed shaft 30 is connected to the driving source 32. The driving source 32 is disposed above the chamber 12. The driving source 32 causes the seed shaft 30 to go up and down. The driving source 32 rotates the seed shaft 30 about the central axis thereof.

When an SiC single crystal is produced, the seed shaft 30 is cooled. To be specific, a coolant gas is circulated inside the seed shaft 30. The coolant gas is, for example, helium gas, etc. The cooling method of the seed shaft 30 is not limited to gas cooling. For example, the seed shaft 30 may be vertically divided into two parts so that the lower half of the seed shaft 30 is gas cooled, and the upper half thereof is water cooled.

The lower end of the seed shaft 30 is located in the crucible 14. An SiC seed crystal 36 is to be attached to the lower end surface 34 of the seed shaft 30.

The SiC seed crystal 36 is plate-shaped. In the present example, the SiC seed crystal 36 is disc-shaped. However, the shape of the SiC seed crystal 36 will not be particularly limited to a disc shape. The shape of the SiC seed crystal 36 may be polygonal, such as, for example, hexagonal and rectangular. The upper surface of the SiC seed crystal 36 provides an attachment surface for the seed shaft 30.

The SiC seed crystal 36 is made up of an SiC single crystal. Preferably, the crystal structure of the SiC seed crystal 36 is the same as that of the SiC single crystal to be produced. For example, when producing an SiC single crystal having 4H polymorphism, an SiC seed crystal having 4H polymorphism is utilized. When an SiC seed crystal 36 having 4H polymorphism is utilized, the surface of the SiC seed crystal 36 is preferably a (0001) plane or a plane inclined by an angle of not more than 8° from the (0001) plane. In such a case, the SiC single crystal will stably grow.

[Configuration of Crucible]

Figure 2:
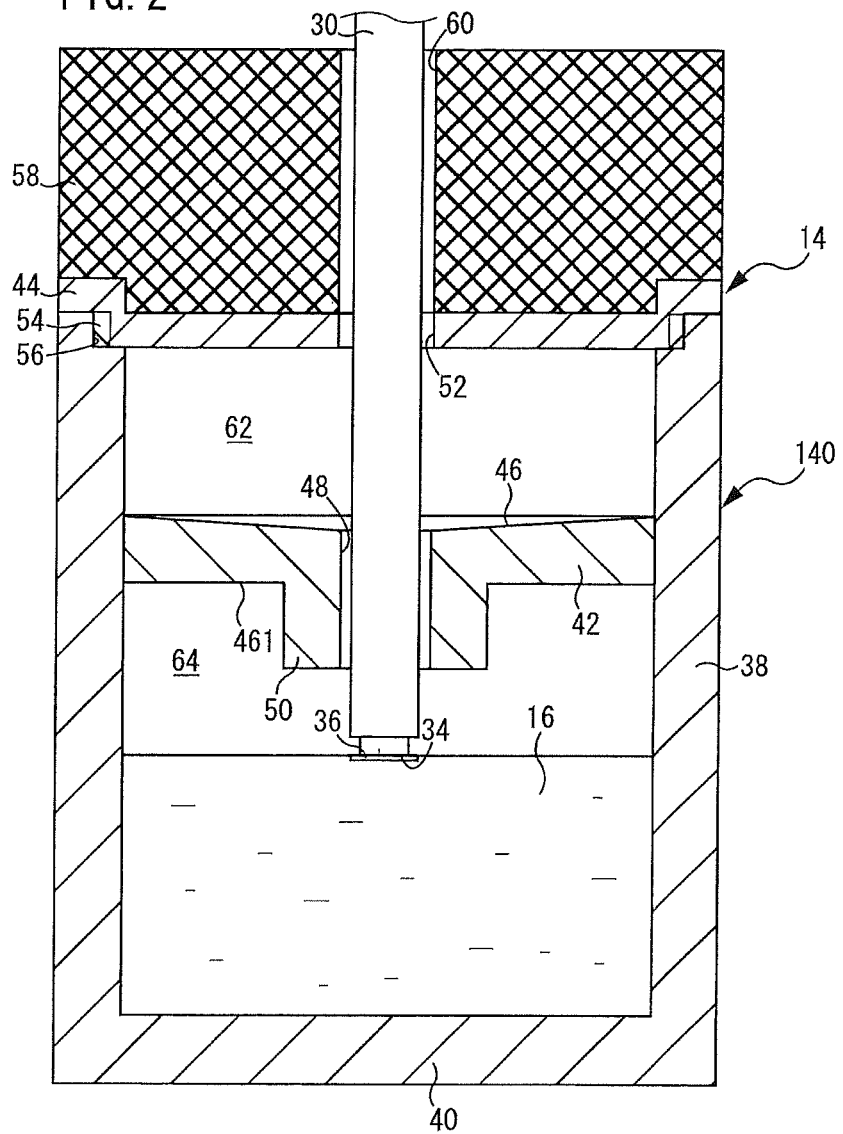
FIG. 2 is a longitudinal sectional view of a crucible in FIG. 1.

FIG. 2 is a longitudinal sectional view of the crucible 14 in FIG. 1. As shown in FIG. 2, the crucible 14 includes a main body 140, an intermediate cover 42, and a top cover 44. Briefly, the crucible 14 includes two covers (the intermediate cover 42 and the top cover 44) which are disposed in upper and lower positions.

The main body 140 is a housing having an opening at an upper end. The main body 140 includes a cylindrical portion 38 and a bottom portion 40. The cylindrical portion 38 extends in a vertical direction. The cylindrical portion 38 is for example a circular cylinder. The inside-diameter dimension of the cylindrical portion 38 is sufficiently larger than the outside-diameter dimension of the seed shaft 30. The bottom portion 40 is disposed at a lower end portion of the cylindrical portion 38. The bottom portion 40 is, for example, integrally formed with the cylindrical portion 38.

The intermediate cover 42 is disposed above the bottom portion 40 apart from the bottom portion 40. The intermediate cover 42 is plate-shaped, and has a through hole 48 in a central portion thereof. The through hole 48 extends in the thickness direction of the intermediate cover 42 from the upper surface 46 up to the lower surface 461 of the intermediate cover 42. The through hole 48 allows the seed shaft 30 to pass therethrough. Therefore, when producing an SiC single crystal, the lower end of the seed shaft 30 is disposed lower than the intermediate cover 42.

The intermediate cover 42 further includes a cylindrical portion 50. The cylindrical portion 50 extends downward from the lower surface 461 of the intermediate cover 42. In FIG. 2, the cylindrical portion 50 is disposed coaxially with the through hole 48, the inner peripheral surface of the cylindrical portion 50 continues smoothly (without any step) to the surface of the through hole 48. The cylindrical portion 50 allows the seed shaft 30 to pass therethrough as with the through hole 48. The lower end of the seed shaft 30 is disposed at a position lower than the lower end of the cylindrical portion 50.

A step may be formed between the inner peripheral surface of the cylindrical portion 50 and the surface of the through hole 48. Provided that the seed shaft 30 can pass through the cylindrical portion 50, the shape of the inner peripheral surface of the cylindrical portion 50 will not be specifically limited.

The intermediate cover 42 is disposed within the cylindrical portion 38, and the outer circumference thereof is to be attached to the inner peripheral surface of the cylindrical portion 38. The intermediate cover 42 may be integrally formed with the cylindrical portion 38, or may be a separate body from the cylindrical portion 38. Preferably, the lower surface 461 of the intermediate cover 42 is approximately parallel with the surface of the bottom portion 40.

The top cover 44 is disposed at a position higher than the intermediate cover 42. In FIG. 2, the top cover 44 is disposed at an upper end of the cylindrical portion 38. The top cover 44 is plate-shaped, and has a through hole 52 in its central portion. The through hole 52 is coaxially disposed with the through hole 48. The through hole 52 allows the seed shaft 30 to pass therethrough as with the through hole 48.

The top cover 44 is to be attached to the upper end of the cylindrical portion 38. In FIG. 2, the top cover 44 is to be attached to the cylindrical portion 38 by means of a thread ridge 54 formed on the outer peripheral surface of the top cover 44 and a thread groove 56 formed in the inner peripheral surface at an upper end of the cylindrical portion 38. However, the top cover 44 may be attached to the cylindrical portion 38 in different ways.

As shown in FIG. 2, a heat insulation member 58 may be disposed on the upper surface of the top cover 44. The heat insulation member 58 may be a part of the heat insulation member 18, or one separately provided other than the heat insulation member 18. The heat insulation member 58 is round-column shaped, and has a through hole 60 in its central portion. The through hole 60 is disposed coaxially with the through holes 48 and 52 and allows the seed shaft 30 to pass through. The heat insulation member 58 may not be provided.

When producing an SiC single crystal, if temperature fluctuates in a region other than the vicinity region of the SiC seed crystal 36 (peripheral region) of the SiC solution 16 in the crucible 14, SiC polycrystals are formed by natural nucleation in the peripheral region, and grow. The SiC polycrystals will impair the growth of the SiC single crystal formed on the SiC seed crystal 36.

The production apparatus 10 suppresses temperature variation in the peripheral region, and inhibits the formation and the growth of the SiC polycrystals. The crucible 14 includes the intermediate cover 42 and the top cover 44 so as to have a heat reserving space 64 and a cooling space 62. The heat reserving space 64 is formed between the SiC solution 16 and the intermediate cover 42. The cooling space 62 is formed between the intermediate cover 42 and the top cover 44.

When producing an SiC single crystal, the radiant heat of the SiC solution 16 is accumulated in the heat reserving space 64. This allows to retain the temperature of the heat reserving space 64. Consequently, the temperature variation in the peripheral region of the SiC solution 16 is suppressed, and thereby the formation of SiC polycrystals is inhibited.

Further, the production apparatus 10 effectively cools a region of the SiC solution 16 in the vicinity of the SiC single crystal 36, causing the vicinity region to be supercooled. As described above, the crucible 14 includes a cooling space 62 above the heat reserving space 64. The cooling space 62 is partitioned from the heat reserving space 64 by the intermediate cover 42. On that account, the temperature of the cooling space 62 is lower than that of the heat reserving space 64. Therefore, the cooling space 62 suppresses a temperature rise of the seed shaft 30. Briefly, the cooling space 62 maintains the heat dissipation effect by the seed shaft 30. Therefore, the seed shaft 30 effectively cools the vicinity region of the SiC solution 16, thereby allowing the vicinity region to be supercooled. Since SiC is supersaturated in the vicinity region, the growth of the SiC single crystal is facilitated. Consequently, the crystal growth rate of the SiC single crystal increases.

Hereafter, the method for producing an SiC single crystal according to the present embodiment will be described in detail.

[Method for Producing SiC Single Crystal]

The method for producing an SiC single crystal according to the present embodiment utilizes the above described production apparatus 10. First, the production apparatus 10 is prepared, and an SiC seed crystal 36 is to be attached to the seed shaft 30 (providing step). Next, the crucible 14 is disposed in the chamber 12 to produce an SiC solution 16 (SiC solution production step). Next, the SiC seed crystal 36 is brought into contact with the SiC solution 16 in the crucible 14 (contacting process). Next, an SiC single crystal is grown (growth step). Hereafter, details of each step will be described.

[Providing Step]

First, the production apparatus 10 is prepared. Then, an SiC seed crystal 36 is to be attached to the lower end surface 34 of the seed shaft 30.

[SiC Solution Production Step]

Next, an SiC raw material is accommodated in the crucible 14. At this moment, the amount of the SiC raw material is adjusted such that the liquid level of the SiC solution to be produced is located at a position lower than the lower surface 461 of the intermediate cover 42. Preferably, the amount of SiC raw material is adjusted such that the heat reserving space 64 is small. It is preferable to house the SiC raw material not only in between the bottom portion 40 and the intermediate cover 42, but also in between the intermediate cover 42 and the top cover 44 such that the heat reserving space 64 becomes small.

Next, the SiC raw material in the crucible 14 is melted to produce an SiC solution 16. First, inert gas is charged into the chamber 12. Then, the SiC raw material in the crucible 14 is heated to above its melting point by the heating apparatus 20. The SiC raw material piled up on the intermediate cover 42 falls off through the through hole 48 when it is melted.

As so far described, since the crucible 14 has a cooling space 62, it is possible not only to accommodate the raw material in between the bottom portion 40 and the intermediate cover 42, but also to accommodate the SiC raw material in the cooling space 62. Therefore, it is possible to put the liquid level of the produced SiC solution 16 closer to the lower surface of the intermediate cover 42. Briefly, the capacity of the heat reserving space 64 can be decreased. Therefore, it is possible to retain the temperature of the liquid surface of the SiC solution 16, thereby reducing the temperature variation in the peripheral region.

Particularly, in the present embodiment, as shown in FIG. 2, the upper surface 46 of the intermediate cover 42 declines from its outer circumference side to the inner circumference side. This facilitates the molten SiC raw material (that is, a produced SiC solution) to flow toward the bottom portion 40 through the through hole 48 when the SIC raw material accommodated in the cooling space 62 melts.

When the crucible 14 is made of graphite, heating the crucible 14 will cause carbon to dissolve into a melt of the SiC raw material from the crucible 14, thereby forming an SiC solution 16. As carbon of the crucible 14 dissolves into the SiC solution 16, the carbon concentration in the SiC solution 16 approaches a saturated concentration.

When the SiC solution 16 is produced, a gap is formed between the liquid level of the SiC solution 16 and the lower surface of the cylindrical portion 50. In other words, the amount of the SiC raw material is adjusted such that the lower surface of the cylindrical portion 50 is located apart from the SiC solution 16. The size of the gap formed between the liquid level of the SiC solution 16 and the lower surface of the cylindrical portion 50 is preferably not less than 5 mm.

[Contacting Step]

Next, an SiC seed crystal 36 is brought into contact with the SiC solution 16. To be specific, the seed shaft 30 is moved down by the driving source 32 to bring the SiC seed crystal 36 into contact with the SiC solution 16. At this moment, since the seed shaft 30 is inserted into the through holes 52 and 48, the cooling space 62 and the heat reserving space 64 become substantially a closed space, respectively.

[Growth Step]

After the SiC seed crystal 36 is brought into contact with the SiC solution 16, the SiC solution 16 is kept at a crystal growth temperature by the heating apparatus 20. Further, a region of the SiC solution 16 in the vicinity of the SiC seed crystal 36 is supercooled such that SiC is supersaturated.

Since the intermediate cover 42 is located above the liquid level of the SiC solution 16, the radiant heat from the SiC solution 16 is accumulated in the heat reserving space 64 while the SiC single crystal is grown. This will cause the temperature of the cooling space 62 to become lower than that of the heat reserving space 64.

Figure 3:
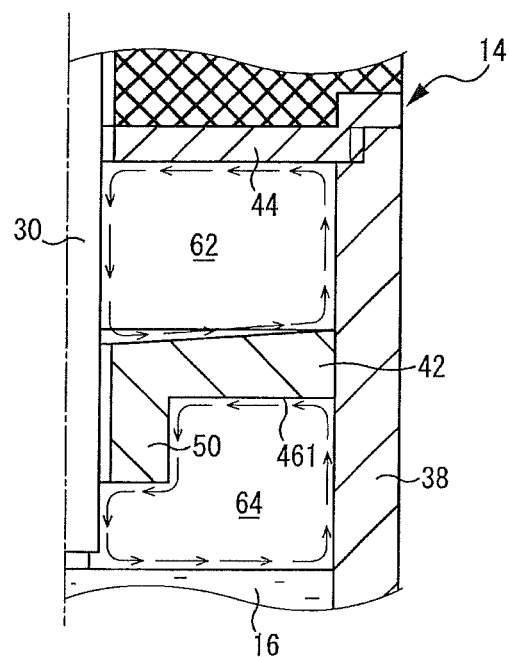
FIG. 3 is a schematic view of a flow pattern of inert gas in a cooling space and a heat reserving space.

The heating apparatus 20 keeps the SiC solution 16 at a crystal growth temperature, and the seed shaft 30 is being cooled. Thereby, in the cooling space 62, temperature is higher on the cylindrical portion 38 than on the seed shaft 30. As a result of this, the inert gas in the cooling space 62 flows as shown in FIG. 3. To be specific, the inert gas that moved up along the inner peripheral surface of the cylindrical portion 38 flows along the lower surface of the top cover 44 from the outer circumference to the inner circumference of the top cover 44. The inert gas flowed to the inner circumference of the top cover 44 moves down along the outer peripheral surface of the seed shaft 30, and thereafter flows along the upper surface 46 of the intermediate cover 42 from the seed shaft 30 to the cylindrical portion 38.

The inert gas is cooled by being brought into contact with the top cover 44 when flowing from the outer circumference to the inner circumference in the cooling space 62. The cooled inert gas comes into contact with the seed shaft 30 while moving downward. Therefore, it is possible to suppress a temperature rise of the seed shaft 30 due to the radiant heat from the SiC solution 16. That is, the cooling space 62 inhibits the impairment of heat dissipation function of the seed shaft 30. Therefore, the heat of the vicinity region of the SiC solution 16 is dissipated by the seed shaft 30 to be supercooled so that SiC in the vicinity region becomes supersaturated.

The SiC seed crystal 36 and the SiC solution 16 are rotated while keeping SiC supersaturated in the region in the vicinity of the SiC seed crystal 36. Rotation of the seed shaft 30 causes the SiC seed crystal 36 to rotate. Rotation of the rotating shaft 24 causes the crucible 14 to rotate. The rotation direction of the SiC seed crystal 36 may be opposite to or the same as the rotation direction of the crucible 14. Moreover, the rotation speed may be constant or may be variable. The seed shaft 30 gradually moves up while rotating. At this moment, an SiC single crystal is formed on the surface of the SiC seed crystal 36 which is in contact with the SiC solution 16, and grows. Note that, the seed shaft 30 may rotate without moving up. Further, the seed shaft 30 may neither move up nor rotate. In such a case, although the growth rate is decreased, the SiC single crystal still grows.

Since the radiant heat from the SiC solution 16 is accumulated in the heat reserving space 64, the temperature variation in the peripheral region in the SiC solution 16 is suppressed. Consequently, the natural nucleation of SiC polycrystals is suppressed.

The heating apparatus 20 keeps the SiC solution 16 at a crystal growth temperature. Therefore, even in the heat reserving space 64, the temperature is higher on the cylindrical portion 38 side than on the seed shaft 30 side as in the cooling space 62. This causes the inert gas in the heat reserving space 64 to flow as shown in FIG. 3. To be specific, the inert gas that has moved up along the inner peripheral surface of the cylindrical portion 38 flows along the lower surface 461 of the intermediate cover 42 from the outer circumference side to the inner circumference side of the intermediate cover 42. The inert gas flowed to the inner circumference side of the intermediate cover 42 moves down along the outer peripheral surface of the cylindrical portion 50, and thereafter moves down along the outer peripheral surface of the seed shaft 30. The inert gas that has moved down along the outer peripheral surface of the seed shaft 30 flows along the liquid level of the SiC solution 16 from the seed shaft 30 side to the cylindrical portion 38 side.

Since the intermediate cover 42 includes a cylindrical portion 50, the inert gas which flows in the heat reserving space 64 is prevented from hitting the seed shaft 30. This makes the temperature of the inert gas become less likely to decline. As a result, the heat reserving effect of the heat reserving space 64 is further improved.

Figure 4:
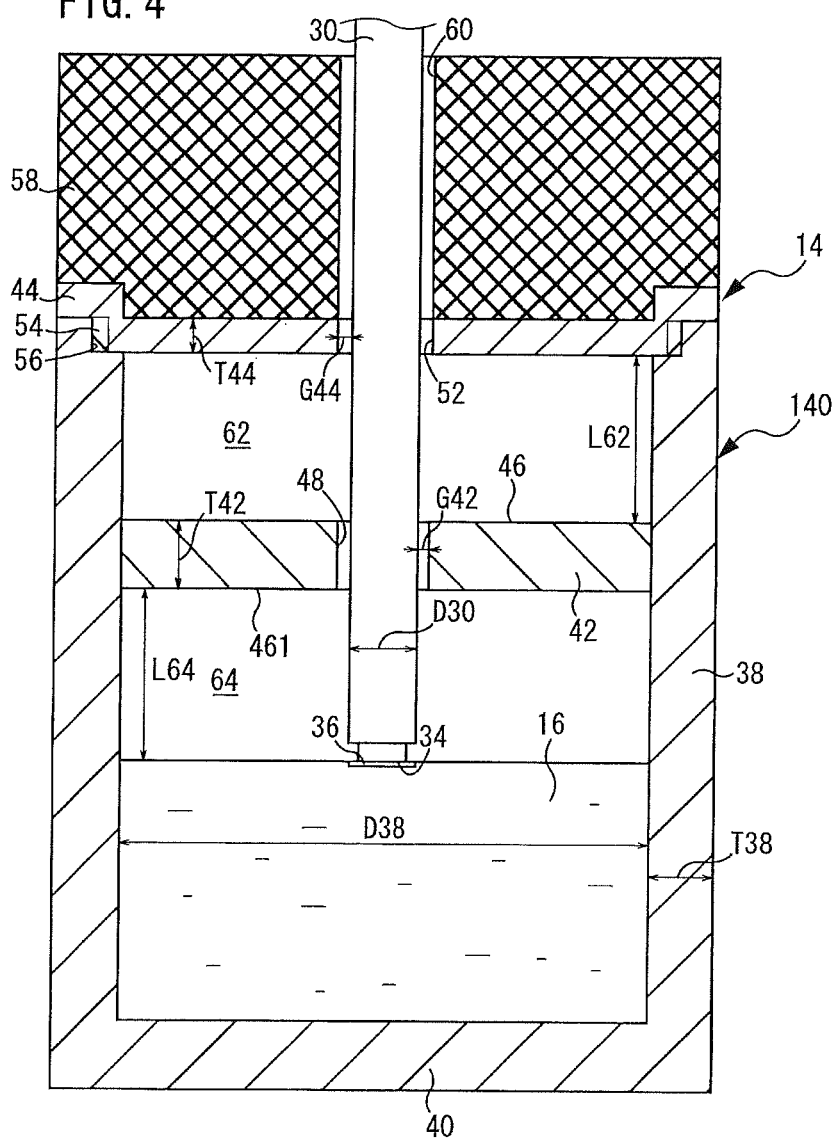
FIG. 4 is a longitudinal sectional view of an another crucible which has a different structure from that of the crucible shown in FIG. 2, and which can be employed in the production apparatus shown in FIG. 1.

The crucible 14 which can be adopted in the present embodiment will not be limited to the structure shown in FIG. 2. For example, as shown in FIG. 4, the intermediate cover 42 may not include the cylindrical portion 50. Moreover, as shown in FIG. 4, the upper surface 46 of the intermediate cover 42 may be flat. Even in such a configuration, a cooling space 62 and a heat reserving space 64 are formed on both sides of the intermediate cover 42 in the crucible 14. As a result, the cooling space 62 inhibits the impairment of the heat dissipation function of the seed shaft 30. Then, the heat reserving space 64 accumulates the radiant heat from the SiC solution 16, and suppresses the temperature variation of the peripheral region in the SiC solution 16. In this case, the distance between the liquid level of the SiC solution 16 and the lower surface of the intermediate cover 42 is preferably not less than 50 mm and not more than 80 mm. Making the distance not less than 50 mm causes a sufficient convection of the inert gas in the heat reserving space 64, thereby facilitating the uniformly heating of the peripheral region of the SiC solution 16. Making the distance not more than 80 mm causes the upper portion of the seed shaft 30 to be sufficiently cooled, thereby increasing the growth rate of the SiC single crystal.

Example

Production of an SiC single crystal by using crucibles having various configurations was assumed. The temperature distribution in each of the assumed crucibles was investigated by simulation.

By using an axially symmetric R-Z system, thermohydraulic analysis was performed by a difference method. In the simulation, assuming a production apparatus having the same configuration as that of FIG. 1, the heating apparatus in the production apparatus was assumed to be a high-frequency coil. First, letting an electric current to be applied to the high-frequency coil be 360 A at 6 kHz, a Joule heat density in the crucible is calculated by electromagnetic field analysis. Next, using the calculated Joule heat density distribution, a thermohydraulic analysis in the crucible was performed. In the thermohydraulic analysis, the crucible and the seed shaft was made up of the same carbon material. Moreover, the inert gas was He, and the component of the SiC solution was Si. A steady state calculation was conducted in the thermohydraulic analysis.

Figure 5:
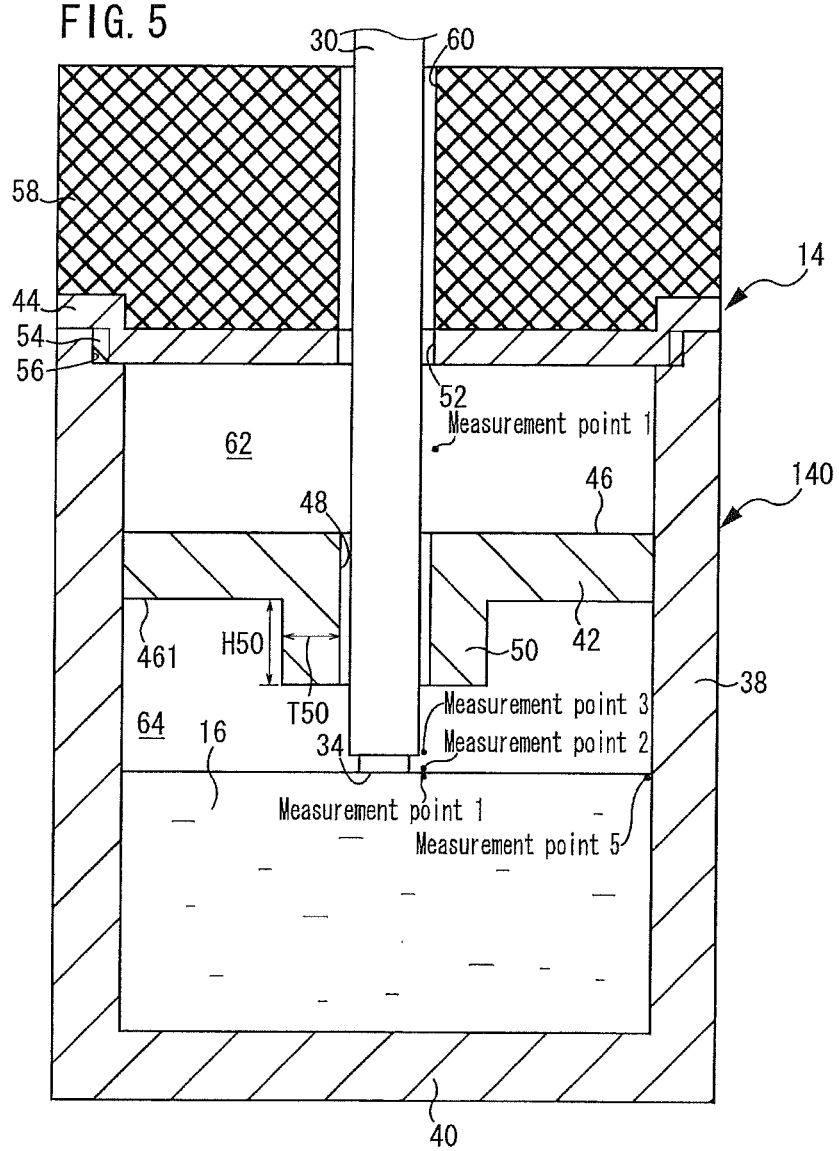
FIG. 5 is a longitudinal sectional view showing measurement points of temperature in a simulation using the production apparatus of FIG. 1.

Further, in the thermohydraulic analysis, four crucibles (Marks 1 to 4) having different shapes were set as the calculation model. The crucible of Mark 1 had a structure shown in FIG. 4. The crucibles of Marks 2 and 3 had the structure shown in FIG. 5. In the crucible of FIG. 5, the upper surface 46 of the intermediate cover 42 was parallel with the lower surface 461 thereof compared with the crucible 14 of FIG. 2. The crucible of Mark 4 had a structure without the intermediate cover 42 as shown in FIG. 6.

In the crucibles of Marks 1 to 4, the inner diameter D38 of the cylindrical portion 38 was 140 mm (see FIG. 4). The wall thickness T38 of the cylindrical portion 38 was 10 mm. The outer diameter D30 of the seed shaft 30 was 50 mm. The distance G44 between the inner peripheral surface of the top cover 44 and the outer peripheral surface of the seed shaft 30 was 5 mm. The thickness T44 of the top cover 44 was 5 mm.

In the crucibles of Marks 1 to 3, the thickness T42 of the intermediate cover 42 was 10 mm. The distance L64 between the intermediate cover 42 and the liquid level of the SiC solution 16 was 50 mm. The distance L62 between the intermediate cover 42 and the top cover 62 was 40 mm. The distance G42 between the inner peripheral surface of the intermediate cover 42 and the outer peripheral surface of the seed shaft 30 was 2.5 mm.

In the crucibles of Marks 2 and 3, a wall thickness T50 (see FIG. 5) of the cylindrical portion 50 was 10 mm. In the crucible of Mark 2, a height H50 of the cylindrical portion 50 (the distance between the lower end of the cylindrical portion 50 and the lower surface 461 of the intermediate cover 42, see FIG. 5) was 20 mm. In the crucible of Mark 3, the height H50 was 30 mm.

In the crucible of Mark 4, the distance L44 (see FIG. 6) between the liquid level of the SiC solution 16 and the lower surface of the top cover 44 was 100 mm.

Measurement points of temperature of a crucible of each Mark are shown in FIG. 5. Measurement point 1 was located near the lower end surface 34 of the seed shaft 30 in the SiC solution 16. Measurement point 2 was located right above the measurement point 1 in a heat reserving space 64. Measurement point 3 was located right above the measurement point 2 in the heat reserving space 64. Measurement point 4 was located near the seed shaft 30 in the cooling space 62. Measurement point 5 was located right near the inner peripheral surface of the cylindrical portion 38 in the SiC solution 16.

The results of simulations under the above described set up conditions are shown in Table 1.

will enable to prevent the lower end surface 34 of the seed shaft 30 from coming into contact with the SiC solution 16.

Further, the crucible may include not less than three covers which are disposed in a vertical arrangement. For example, in the above described embodiment, an intermediate cover 42 may be further provided between the top cover 44 and the intermediate cover 42.

The invention claimed is:

1. A production apparatus of an SiC single crystal by a solution growth method, comprising:
   a seed shaft having a lower end surface to which an SiC seed crystal is to be attached; and
   a crucible for accommodating an SiC solution, wherein the crucible comprising:
   a main body including a first cylindrical portion, and a bottom portion disposed at a lower end portion of the first cylindrical portion;
   an intermediate cover disposed within the first cylindrical portion and above the liquid level of the SiC solution in the main body, a first space being formed between the SIC solution and the intermediate cover, the intermediate cover having a first through hole through which the seed shaft is to be passed;
   a top cover disposed above the intermediate cover, a second empty space being formed between the inter-

TABLE 1

| | Temperature of measurement point 1 (° C.) | Temperature of measurement point 2 (° C.) | Temperature of measurement point 3 (° C.) | Temperature of measurement point 4 (° C.) | Temperature of measurement point 5 (° C.) | Temperature difference between measurement points 3 and 4 (° C.) | Temperature difference between measurement points 1 and 5 (° C.) |
|---|---|---|---|---|---|---|---|
| Mark 1 | 2003 | 1998 | 1953 | 1808 | 2007 | 145 | 4 |
| Mark 2 | 2000 | 1997 | 1957 | 1806 | 2004 | 151 | 4 |
| Mark 3 | 2000 | 1997 | 1962 | 1804 | 2004 | 158 | 4 |
| Mark 4 | 2069 | 2063 | 1998 | 1894 | 2077 | 104 | 8 |

The temperature difference between the measurement points 3 and 4 was 145° C. in the crucible of Mark 1; 151° C. in the crucible of Mark 2; 158° C. in the crucible of Mark 3; and 104° C. in the crucible of Mark 4. The results confirmed that the temperature difference between the heat reserving space 64 and the cooling space 62 (the temperature difference between the measurement points 3 and 4) was larger in the crucibles including the intermediate cover 42 (crucibles of Marks 1 to 3) than in crucibles without the intermediate cover 42 (the crucible of Mark 4). The results also confirmed that the temperature difference between the heat reserving space 64 and the cooling space 62 became larger as the height of the cylindrical portion 50 increases in the crucibles in which the intermediate cover 42 included the cylindrical portion 50 (the crucibles of Marks 2 and 3).

The temperature difference between the measurement points 1 and 5 was 4° C. in the crucibles of Marks 1 to 3; and 8° C. in the crucible of Mark 4. The results confirmed that the temperature variation in the peripheral region of the SiC solution 16 was suppressed in the crucibles including the intermediate cover 42 (the crucibles of Marks 1 to 3) than in the crucible without the intermediate cover 42 (the crucible of Mark 4).

Although the embodiments of the present invention have been so far described in detail, these are merely exemplary, and the present invention will not be limited in any way by the above described embodiments.

For example, in the above described embodiment, an SiC seed crystal 36 having a block shape may be adopted. This mediate cover and the top cover, the top cover having a second through hole through which the seed shaft is to be passed; and
the top surface of the intermediate cover declines from an outer circumference side to an inner circumference side.

2. The production apparatus according to claim 1, wherein the intermediate cover further comprises a second cylindrical portion extending downwardly from the lower surface of the intermediate cover, the seed shaft being adapted to pass through the second cylindrical portion, and the second cylindrical portion having a lower end located apart from the liquid level of the SiC solution.

3. A crucible capable of accommodating an SiC solution and used in a production apparatus of an SiC single crystal for a solution growth method and, the apparatus comprising a seed shaft having a lower end to which an SiC seed crystal can be attached, the crucible comprising:
   a main body including a first cylindrical portion, and a bottom portion disposed at a lower end portion of the first cylindrical portion;
   an intermediate cover disposed within the cylindrical portion, and having a first through hole through which the seed shaft is to be passed, a first space being formed between the SiC solution and the intermediate cover when the SiC solution is contained in the crucible;
   a top cover disposed above the intermediate cover, and having a second through hole through which the seed shaft is to be passed, a second empty space being formed between the intermediate cover and the top cover; and the upper surface of the intermediate cover declines from an outer circumference side to an inner circumference side.

4. The crucible according to claim 3, wherein
the intermediate cover further comprises a second cylindrical portion extending downwardly from the lower surface of the intermediate cover, and through which the seed shaft is to be passed.

5. A method for producing an SiC single crystal by a solution growth method, the method comprising the steps of:
providing a production apparatus including a seed shaft that extends in a vertical direction;
providing a crucible comprising: a main body including a cylindrical portion and a bottom portion disposed at a lower end portion of the cylindrical portion, an intermediate cover disposed within the main body and having a first through hole through which the seed shaft is to be passed, a first space being formed between the SiC solution and the intermediate cover when the SiC solution is contained in the crucible; and a top cover disposed above the intermediate cover and having a second through hole through which the seed shaft is to be passed, a second empty space being formed between the intermediate cover and the top cover;
attaching an SiC seed crystal to a lower end surface of the seed shaft;
heating the crucible housing a raw material to produce the SiC solution;
bringing the SiC seed crystal attached to the lower end surface of the seed shaft into contact with the SiC solution;
growing an SiC single crystal on the SiC seed crystal; and
housing a raw material of the SiC solution in the crucible such that the liquid level of the SiC solution to be produced is located below the intermediate cover before forming the SiC solution.

* * * * *